(12) United States Patent
Ohno et al.

(10) Patent No.: US 9,450,177 B2
(45) Date of Patent: Sep. 20, 2016

(54) MAGNETORESISTIVE ELEMENT AND MAGNETIC MEMORY

(75) Inventors: Hideo Ohno, Sendai (JP); Shoji Ikeda, Sendai (JP); Fumihiro Matsukura, Sendai (JP); Masaki Endoh, Sendai (JP); Shun Kanai, Sendai (JP); Katsuya Miura, Higashimurayama (JP); Hiroyuki Yamamoto, Shiki (JP)

(73) Assignee: TOHOKU UNIVERSITY, Sendai-Shi, Miyagi (JP)

( * ) Notice: Subject to any disclaimer, the term of this patent is extended or adjusted under 35 U.S.C. 154(b) by 0 days.

(21) Appl. No.: 13/578,866

(22) PCT Filed: Feb. 14, 2011

(86) PCT No.: PCT/JP2011/052999
§ 371 (c)(1),
(2), (4) Date: Aug. 14, 2012

(87) PCT Pub. No.: WO2011/111473
PCT Pub. Date: Sep. 15, 2011

(65) Prior Publication Data
US 2012/0320666 A1    Dec. 20, 2012

(51) Int. Cl.
*G11C 11/16* (2006.01)
*H01L 43/08* (2006.01)
*H01L 27/22* (2006.01)

(52) U.S. Cl.
CPC .............. *H01L 43/08* (2013.01); *G11C 11/161* (2013.01); *H01L 27/228* (2013.01)

(58) Field of Classification Search
CPC .............................. G11C 11/16; G11C 11/161
USPC .................................. 365/158, 171, 158.171
See application file for complete search history.

(56) References Cited

U.S. PATENT DOCUMENTS

RE28,500 E    7/1975  Bresee et al.
7,538,402 B2  5/2009  Fukumoto
(Continued)

FOREIGN PATENT DOCUMENTS

JP   2005-116923 A   4/2005
JP   2007-142364 A   6/2007
(Continued)

OTHER PUBLICATIONS

Sebastian van Dijken et al., "Correlation between perpendicular exchange bias and magnetic anisotropy in IrMn/[Co/Pt]n and [Pt/Co]n/IrMn multilayers", Journal of Applied Physics, 97, 063907 (2005).*

(Continued)

*Primary Examiner* — Huan Hoang
*Assistant Examiner* — Jay Radke
(74) *Attorney, Agent, or Firm* — Rabin & Berdo, P.C.

(57) ABSTRACT

There is provided a magnetoresistive element whose magnetization direction is stable in a direction perpendicular to the film surface and whose magnetoresistance ratio is controlled, as well as magnetic memory using such a magnetoresistive element. By having the material of a ferromagnetic layer forming the magnetoresistive element comprise a ferromagnetic material containing at least one type of 3d transition metal, or a Heusler alloy, to control the magnetoresistance ratio, and by controlling the thickness of the ferromagnetic layer on an atomic layer level, the magnetization direction is changed from being in-plane with the film surface to being perpendicular to the film surface.

13 Claims, 7 Drawing Sheets

(56) References Cited

U.S. PATENT DOCUMENTS

| | | | |
|---|---|---|---|
| 8,072,800 B2 | 12/2011 | Chen et al. | |
| 8,120,127 B2 | 2/2012 | Nagahara et al. | |
| 8,154,913 B2 | 4/2012 | Fukami et al. | |
| 8,247,093 B2 | 8/2012 | Rodmacq et al. | |
| 8,374,025 B1* | 2/2013 | Ranjan et al. | 365/171 |
| 8,565,013 B2 | 10/2013 | Bessho et al. | |
| 8,593,862 B2 | 11/2013 | Ranjan et al. | |
| 8,625,342 B2 | 1/2014 | Higo et al. | |
| 8,917,541 B2 | 12/2014 | Ohno et al. | |
| 2004/0001372 A1* | 1/2004 | Higo et al. | 365/200 |
| 2005/0104101 A1* | 5/2005 | Sun | B82Y 25/00 257/295 |
| 2005/0117392 A1 | 6/2005 | Hayakawa et al. | |
| 2006/0023497 A1* | 2/2006 | Kawazoe et al. | 365/158 |
| 2006/0262594 A1 | 11/2006 | Fukumoto | |
| 2007/0086121 A1* | 4/2007 | Nagase et al. | 360/324.1 |
| 2007/0228501 A1 | 10/2007 | Nakamura et al. | |
| 2008/0031035 A1* | 2/2008 | Rodmacq et al. | 365/171 |
| 2008/0089118 A1 | 4/2008 | Kajiyama | |
| 2008/0253174 A1* | 10/2008 | Yoshikawa | G11C 11/16 365/158 |
| 2009/0080239 A1* | 3/2009 | Nagase | H01L 27/228 365/158 |
| 2009/0091863 A1 | 4/2009 | Hosotani et al. | |
| 2009/0207724 A1* | 8/2009 | Yanagi et al. | 369/283 |
| 2009/0323404 A1* | 12/2009 | Jung et al. | 365/158 |
| 2010/0118600 A1* | 5/2010 | Nagase | B82Y 25/00 365/158 |
| 2010/0188893 A1 | 7/2010 | Zhou | |
| 2010/0233515 A1 | 9/2010 | Kong et al. | |
| 2011/0049659 A1 | 3/2011 | Suzuki et al. | |
| 2011/0063899 A1 | 3/2011 | Ogimoto | |
| 2011/0064969 A1 | 3/2011 | Chen et al. | |
| 2011/0170339 A1 | 7/2011 | Wunderlich et al. | |
| 2012/0012953 A1* | 1/2012 | Lottis | B82Y 25/00 257/421 |
| 2012/0018822 A1 | 1/2012 | Gaudin et al. | |
| 2012/0020152 A1 | 1/2012 | Gaudin et al. | |
| 2012/0043631 A1 | 2/2012 | Ohmori et al. | |
| 2012/0063221 A1 | 3/2012 | Yamane et al. | |
| 2012/0261777 A1 | 10/2012 | Shukh | |
| 2012/0280336 A1 | 11/2012 | Jan et al. | |
| 2013/0028013 A1 | 1/2013 | Ikeda et al. | |
| 2013/0032910 A1* | 2/2013 | Jung | G11C 11/161 257/421 |
| 2013/0141966 A1 | 6/2013 | Ohno et al. | |
| 2013/0270661 A1* | 10/2013 | Yi | H01L 43/08 257/421 |
| 2014/0340961 A1* | 11/2014 | Ohno | H01L 43/08 365/158 |

FOREIGN PATENT DOCUMENTS

| | | |
|---|---|---|
| JP | 2007-157840 A | 6/2007 |
| JP | 2007-266498 A | 10/2007 |
| JP | 2008-098515 A | 4/2008 |
| JP | 2009-81315 A | 4/2009 |
| JP | 2009-094104 A | 4/2009 |
| JP | 2011-155073 A | 8/2011 |
| JP | 2011-258596 A | 12/2011 |
| JP | 2012-064625 A | 3/2012 |
| JP | 2012-235015 A | 11/2012 |
| WO | WO-2009/093387 A1 | 7/2009 |
| WO | WO 2009/098769 A1 | 8/2009 |
| WO | WO 2009/098796 A1 * | 8/2009 ............ G11C 11/15 |
| WO | WO 2009/133650 A1 | 11/2009 |

OTHER PUBLICATIONS

Sebastian van Dijken et al., "IrMn as exchange-biasing material in systems with perpendicular magnetic anisotropy", Journal of Applied Physics 97, 10k114 (2005).*

R. Lavrijsen et al., "Tuning the interlayer exchange coupling between single perpendicularly magnetized CoFeB layers", Applied Physics Letters 100, 052411 (2012).*

Xu Zhang et al., "Large Perpendicular Exchange Bias in CoFeB/MgO Systems Pinned by a Bottom IrMn Layer via an interfacial CoFe/Ta Composite Layer", IEEE Transactions on Magnetics, vol. 51, No. 11, Nov. 2015.*

Japanese Office Action with partial English translation dated Sep. 24, 2013 (six (6) pages).

International Search Report with English translation dated Apr. 26, 2011 (four (4) sheets).

Form PCT/ISA/237 (three (3) sheets).

Mangin et al., "Current-Induced Magnetization Reversal in Nanopillars with Perpendicular Anisotropy", Nature Materials, vol. 5, Mar. 2006, pp. 210-215 (six (6) sheets).

H. Sukegawa et al. "Significant Magnetoresistance Enhancement Due to a Cotunneling Process in a Double Tunnel Junction with Single Discontinuous Ferromagnetic Layer Insertion", Feb. 18, 2005, pp. 068304-1-068304-4, Physical Review Letters.

T. Miyazaki et al., "Spintronics: Foundation of MRAM Memory for Next Generation," 2007, pp. 96 and 97, Nikkan Kogyo Shimbun.

Endo et al. "Electric-Field Effects on Thickness Dependent Magnetic Anisotropy of Sputtered $MgO/Co_{40}Fe_{40}B_{20}/Ta$ Structures" *Applied Physics Letters*, vol. 96, (2010), 212503.

Ikeda et al., "A Perpendicular-Anisotropy CoFeB—MgO Magnetic Tunnel Junction" *Nature Materials*, vol. 9, (Sep. 2010), pp. 721-724, published online Jul. 11, 2010.

Yamanouchi et al., "Dependence of Magnetic Anisotropy on MgO Thickness and Buffer Layer in $Co_{20}Fe_{60}B_{20}$—MgO Structure" *Journal of Applied Physics*, vol. 109, (2011), pp. 07C712-1 to 07C712-3.

Worledge et al., "Spin Torque Switching of Perpendicular Ta | CoFeB | MgO-based Magnetic Tunnel Junctions" *Applied Physics Letters*, vol. 98, (2011), pp. 022501-1 to 022501-3.

Parkin, "Systematic Variation of the Strength and Oscillation Period of Indirect Magnetic Exchange Coupling through the 3d, 4d, and 5d Transistion Metals," *Physical Review Letter*, vol. 67, No. 25, (1991), pp. 3598-3601.

Yang et al., "First-principles Investigation of the Very Large Perpendicular Magnatic Anisotropy at Fe | MgO and Co | MgO Interfaces" *Physical Review B*, vol. 84, (2011), pp. 054401-1 to 054401-5.

Abraham et al., "Investigation of Perpendicular Interface Magnetic Anisotropy in CoFeB Films Using Seed and Insertion Layers" *The 56th Magnetism and Magnetic Materials Conference*, (2011).

Japanese Office Action dated Nov. 11, 2014, with English translation (six (6) pages).

Japanese Office Action dated Mar. 3, 2015, with English translation (four (4) pages).

\* cited by examiner

MAGNETORESISTIVE ELEMENT AND MAGNETIC MEMORY

TECHNICAL FIELD

The present invention relates to a magnetoresistive element, and to magnetic memory comprising such a magnetoresistive element as a memory cell.

BACKGROUND ART

As shown in FIG. 1, a memory cell 100 of magnetic random access memory (MRAM) has a structure where a magnetoresistive element 101 and a select transistor 102 are electrically connected in series. The source electrode, drain electrode, and gate electrode of the select transistor 102 are electrically connected with a source line 103, with a bit line 104 via the magnetoresistive element 101, and with a word line 105, respectively. The basic structure of the magnetoresistive element 101 is a three-layer structure in which a non-magnetic layer 108 is sandwiched by two ferromagnetic layers, namely a first ferromagnetic layer 106 and a second ferromagnetic layer 107. In the illustrated example, the first ferromagnetic layer 106 has a fixed magnetization direction and serves as a reference layer. The second ferromagnetic layer 107 has a variable magnetization direction and serves as a recording layer. This magnetoresistive element 101 has a low resistance when the magnetization direction of the first ferromagnetic layer 106 and the magnetization direction of the second ferromagnetic layer 107 are mutually parallel (P state), and a high resistance when they are anti-parallel (AP state). With MRAM, this change in resistance is made to correspond to bit information of "0" and "1". Bit information is written through spin-transfer torque magnetization switching caused by the current flowing through the magnetoresistive element 101. When a current flows from the reference layer to the recording layer, the magnetization of the recording layer becomes anti-parallel to the magnetization of the reference layer, and the bit information becomes "1". When a current flows from the recording layer to the reference layer, the magnetization of the recording layer becomes parallel to the magnetization of the reference layer, and the bit information becomes "0". Since the speed of magnetization switching by current is approximately 1 nanosecond, MRAM can be written to at an extremely high speed. In addition, since bit information is recorded by way of the magnetization direction of the recording layer, MRAM is non-volatile, and is able to keep standby power consumption low. Accordingly, there are high expectations for MRAM as a next-generation memory.

In addition, although the case illustrated in FIG. 1 is one where the first ferromagnetic layer 106 of the magnetoresistive element 101 is a reference layer, and the second ferromagnetic layer 107 a recording layer, it would still similarly operate as MRAM even if the first ferromagnetic layer 106 of the magnetoresistive element 101 were made to be a recording layer with a variable magnetization direction, and the second ferromagnetic layer 107 a reference layer with a fixed magnetization direction. In this case, too, when a current flows from the reference layer to the recording layer, the magnetization of the recording layer becomes anti-parallel to the magnetization of the reference layer, and the bit information becomes "1". When a current flows from the recording layer to the reference layer, the magnetization of the recording layer becomes parallel to the magnetization of the reference layer, and the bit information becomes "0".

CITATION LIST

Non-Patent Literature

Non-Patent Literature 1: S. MANGIN, D. RAVELOSONA, J. A. KATINE, M. J. CAREY, B. D. TERRIS and ERIC E. FULLERTON, "Current-induced magnetization reversal in nanopillars with perpendicular anisotropy", Nature Mater. 5, 210 (2006).

SUMMARY OF INVENTION

Technical Problem

There are obstacles to realizing MRAM, chief examples thereof being the conditions that three characteristics of the magnetoresistive element as a recording element must satisfy, namely, magnetoresistance ratio (MR ratio), switching current density, and thermal stability factor. These conditions vary depending on the density, feature size, operation speed, etc., of the MRAM. By way of example, the higher the read speed is, the higher the required magnetoresistance ratio value becomes. Although it varies depending on whether the MRAM is an embedded memory or a standalone memory, a high magnetoresistance ratio of 50% to upwards of 100% is generally required. In addition, to increase write speed and reduce power consumption, a switching current density of $2 \times 10^6$ A/cm$^2$ or less is required. Further, for a retention time of 10 years or longer and to prevent write errors, a thermal stability factor of 80 or greater is required.

There is known a configuration where a material containing a 3d transition metal element is used for the first ferromagnetic layer 106 and the second ferromagnetic layer 107, and MgO for a first non-magnetic layer, to achieve a high magnetoresistance ratio. In this case, it is preferable that the material containing a 3d transition metal element crystallize into a bcc structure through annealing. This is because when the material containing a 3d transition metal element is of a bcc structure, it has an advantage in that it achieves coherent conduction with MgO, as a result of which the magnetoresistance ratio tends to be high. In this case, the magnetization directions of the first ferromagnetic layer 106 and the second ferromagnetic layer 107 become parallel to the film surface as in FIG. 1. On the other hand, when a multi layer film of Co and Pt, Ni and Pt, etc., or a perpendicular magnetic anisotropy material, chief examples of which are such alloys as FePt, TbTeCo, etc., is used for the first ferromagnetic layer 106 and the second ferromagnetic layer 107 as in Non-Patent Literature 1, it is said that a low switching current density and a high thermal stability factor can be achieved. This is due to the fact that the magnetization directions of the first ferromagnetic layer 106 and the second ferromagnetic layer 107 become perpendicular to the film surface. However, in the case of a combination of such perpendicular magnetic anisotropy materials and MgO, the magnetoresistance ratio becomes small. For this reason, the current situation is such that methods in which a material containing a 3d transition metal element of a bcc structure and whose magnetization is parallel to the film surface is inserted between MgO and a perpendicular magnetic anisotropy material, thereby increasing the MR ratio, and so forth, are being tried. However, with such methods, the structure becomes complex, and problems remain such as controlling the magnetization direction of the material containing a 3d transition metal element, the fact that the magnetoresistance ratio does not become as high as anticipated, etc.

Solution to Problem

In order to solve the problems discussed above, the material used for at least one of the first ferromagnetic layer 106 and second ferromagnetic layer 107 forming the magnetoresistive element in FIG. 1 is made to comprise a ferromagnetic layer with a small damping constant, such as a material containing at least one type of 3d transition metal, e.g., Co, Fe, etc., or a Heusler alloy, chief examples of which include $Co_2MnSi$, etc., thereby controlling the magnetoresistance ratio. Ordinarily, when a magnetoresistive element is fabricated with a material containing at least one type of 3d transition metal, e.g., Co, Fe, etc., and which becomes a bcc structure, the magnetization directions of the ferromagnetic layers become parallel to the film surface. However, the present inventors have developed a technique that achieves a low switching current density and a high thermal stability factor by controlling the thicknesses of the ferromagnetic layers to be 3 nm or less and making their magnetization directions perpendicular to the film surface.

With regard to an example in which CoFeB is used for the ferromagnetic layers, FIG. 2 shows, with respect to the temperature of the annealing step included in the fabrication process, the thickness that was required for the magnetization direction to become perpendicular to the film surface. In this example, annealing was performed over a period of one hour. The white circles and black circles in the chart represent the upper and lower limits of thickness, respectively. As can be seen in the chart, the thickness range of CoFeB for which the magnetization direction becomes perpendicular to the film surface varies with respect to annealing temperature. In addition, when this material is used, the magnetization direction becomes perpendicular to the film surface even in the absence of any annealing as can be seen in FIG. 2. When no annealing is performed, CoFeB is amorphous. When amorphous, as will be discussed later, although there is a disadvantage in that the resistance ratio becomes small, there is an advantage in that the magnitude of the magnetization is small.

The example in FIG. 2 is for CoFeB. For a material containing at least one type of 3d transition metal other than the above, the relationship between annealing temperature and the thickness required for the magnetization direction to become perpendicular to the film surface may in some cases differ from that in FIG. 2. However, by controlling the thickness so as to be appropriate for the material, it is possible to change the magnetization direction from being parallel to the film surface to being perpendicular. It is found that what causes the magnetization direction to thus become perpendicular to the film surface is an atypical anisotropy change at the interface of CoFeB. By making the CoFeB film thinner by controlling it to an atomic layer level, the proportion of the volume within reach of the interface effect may be increased relative to the volume of the CoFeB layer. Consequently, the effect of the atypical anisotropy of the interface is manifested prominently, and the magnetization direction becomes perpendicular to the film surface. It is found that this effect is particularly prominent at interfaces between a compound containing oxygen, chief examples thereof being MgO, $Al_2O_3$, $SiO_2$, etc., and a ferromagnetic material comprising at least one type of 3d transition metal, e.g., Co, Fe, etc., and that there is a tendency for magnetization to become perpendicular to the film surface more readily.

On the other hand, FIG. 3 shows, with respect to annealing temperature, the magnetoresistance ratio of a magnetoresistive element in a case where, by way of example, CoFeB is used for the first ferromagnetic layer 106 and the second ferromagnetic layer 107. As the annealing temperature rises, the magnetoresistance ratio increases. Accordingly, in this example, in order to obtain a magnetoresistance ratio of 70% for example, annealing may be performed at approximately 250° C., or in order to obtain a magnetoresistance ratio of 100%, annealing may be performed at 300° C. In so doing, assuming the annealing temperature is 300° C., FIG. 2 indicates that, in order to obtain a magnetoresistive element having a magnetization direction that is perpendicular to the film surface, the thicknesses of the first ferromagnetic layer 106 and the second ferromagnetic layer 107 may be controlled to be approximately 1.0 nm to 1.6 nm.

Even in cases where other materials are used, by examining the relationship between annealing temperature and magnetoresistance ratio in advance, it is possible to fabricate a magnetoresistive element with which the desired magnetoresistance ratio is achieved and in which the magnetization direction is perpendicular to the film surface. FIG. 4 shows the change in resistance of a magnetoresistive element with respect to a magnetic field applied perpendicularly to the film surface with regard to a case where CoFeB is used as the material of the first ferromagnetic layer 106 and the second ferromagnetic layer 107, and MgO for the non-magnetic layer 108. In this example, the annealing temperature was 300° C. From the experiment results, it can be seen that the magnetization direction is perpendicular to the film surface. In addition, the magnetoresistance ratio in this case was 100%.

Advantageous Effects of Invention

By employing the present invention, a magnetoresistive element with a large magnetoresistance ratio and whose magnetization direction is perpendicular to the film surface may be fabricated with ease. In addition, if one wishes to control the magnetoresistance ratio, by controlling the annealing temperature while adjusting the thicknesses of a first ferromagnetic layer and a second ferromagnetic layer so formed as to sandwich a non-magnetic layer, a magnetoresistive element that maintains a magnetization direction perpendicular to the film surface may be fabricated.

DESCRIPTION OF EMBODIMENTS

Magnetic memory and magnetoresistive elements to which the present invention is applied are described in detail below with reference to the drawings.

EXAMPLE 1

Figure 5:
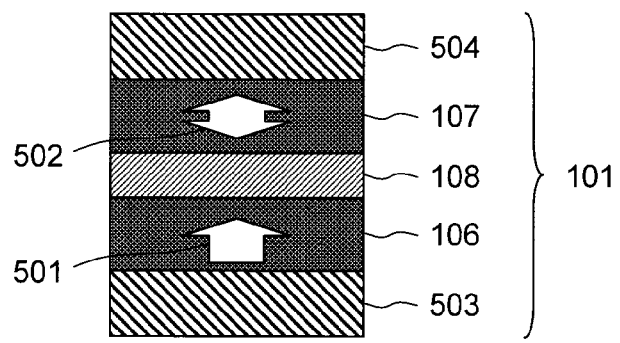
FIG. 5 is a schematic sectional view showing an example of a magnetoresistive element according to the present invention.

According to an aspect of the present invention, the magnetoresistive element 101 comprises, as shown in FIG. 5, the first ferromagnetic layer 106 with a fixed magnetization direction, the second ferromagnetic layer 107 with a variable magnetization direction, and the non-magnetic layer 108 electrically connected between the first ferromagnetic layer and the second ferromagnetic layer. For the material of the first ferromagnetic layer 106 and the second ferromagnetic layer 107, a ferromagnetic material containing at least one type of 3d transition metal element, e.g., Co, Fe, etc., or a Heusler alloy, chief examples of which include $Co_2MnSi$, etc., is preferable. For the material of the non-magnetic layer 108, compounds containing oxygen, e.g., MgO, $Al_2O_3$, $SiO_2$, etc., and metals, e.g., Cu, etc., are candidates, where a material that results in a large magnetoresistance ratio is preferable. For Example 1, a description is provided taking as an example a case where the material of the first ferromagnetic layer 106 and the second ferromagnetic layer 107 is CoFeB, and the non-magnetic layer 108 comprises MgO.

Figure 1:
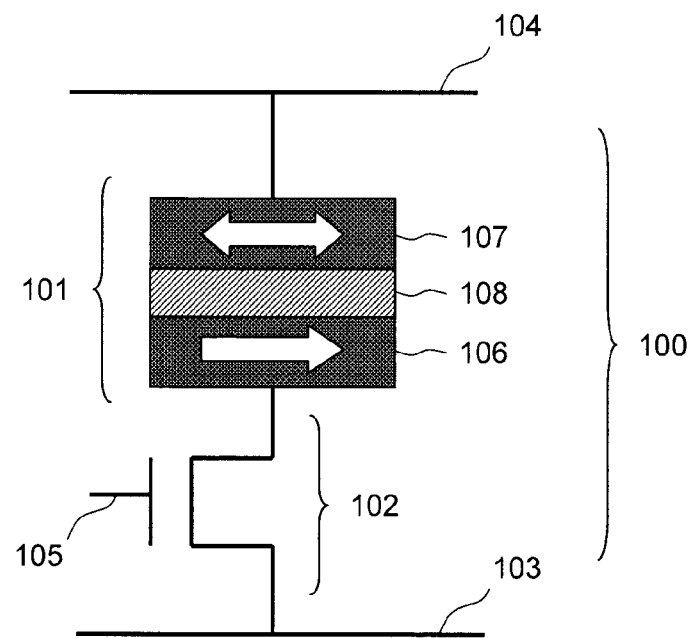
FIG. 1 is a schematic view showing a basic structure of a memory cell of magnetic memory.
Figure 2:
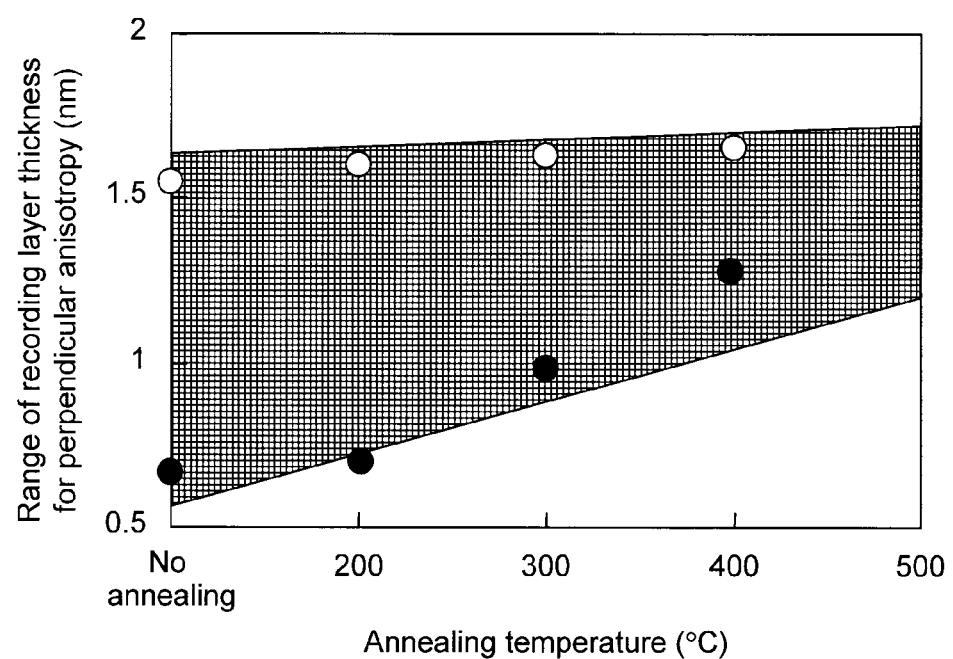
FIG. 2 is a diagram showing, with respect to annealing temperature, changes in the thickness required for the magnetization direction of a magnetoresistive element to become perpendicular to the film surface for a case where CoFeB is used for a first ferromagnetic layer and a second ferromagnetic layer.
Figure 3:
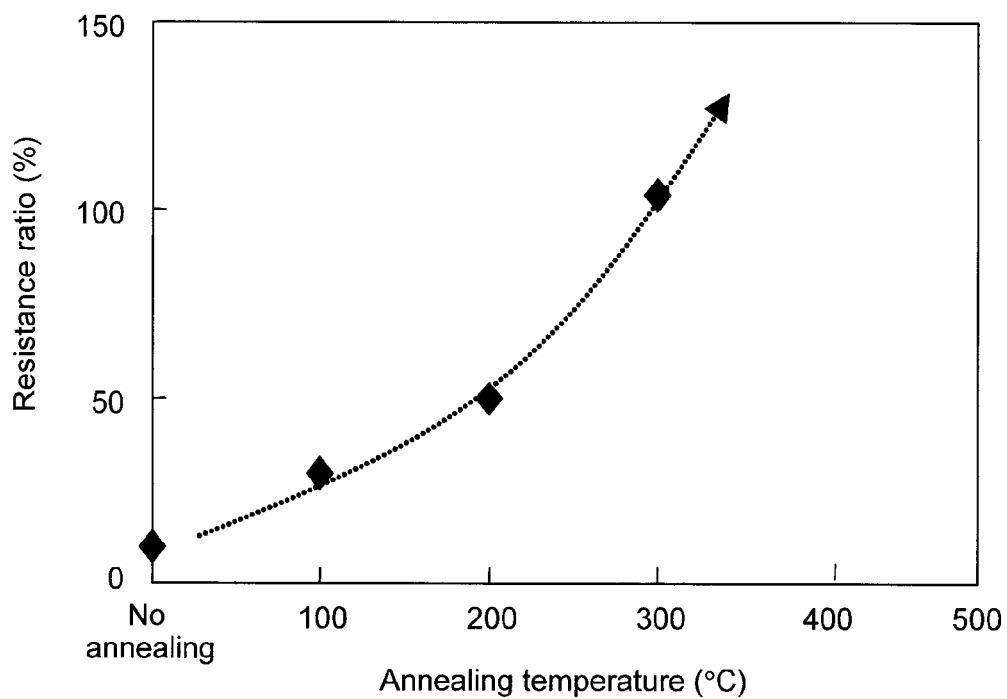
FIG. 3 is a diagram showing changes in the magnetoresistance ratio of a magnetoresistive element with respect to annealing temperature for a case where CoFeB is used for a first ferromagnetic layer and a second ferromagnetic layer.
Figure 4:
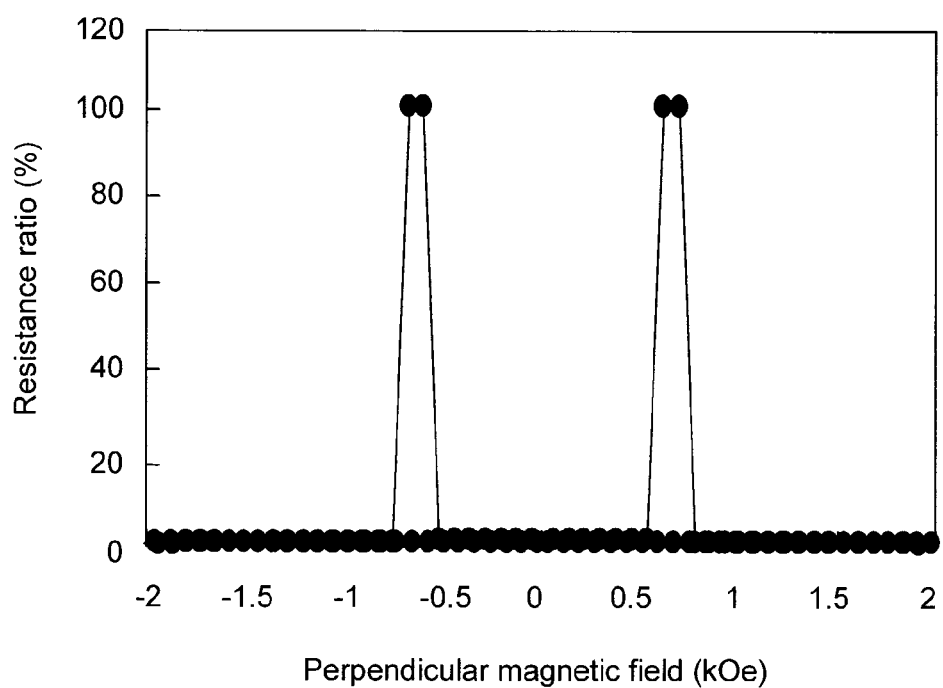
FIG. 4 is a diagram showing changes in the resistance of a magnetoresistive element with respect to a magnetic field applied perpendicularly to the film surface for a case where CoFeB is used for a first ferromagnetic layer and a second ferromagnetic layer.

As shown in FIG. 2, by controlling the thicknesses of the first ferromagnetic layer 106 and the second ferromagnetic layer 107 to be approximately 1.0 nm to 1.6 nm, magnetization 501 of the first ferromagnetic layer 106 and magnetization 502 of the second ferromagnetic layer 107 become perpendicular to the film surface when the annealing temperature is 300° C. As shown in FIG. 3, in this case, a magnetoresistance ratio of 100% or above is achieved. In the example in FIG. 5, by providing a difference in thickness between the first ferromagnetic layer 106 and the second ferromagnetic layer 107 within a range where the magnetization directions are perpendicular to the film surface, a difference in coercivity was created, the first ferromagnetic layer 106 was made to be a reference layer, and the second ferromagnetic layer 107 was made to be a recording layer. As an example, the first ferromagnetic layer 106 was made to be 1.0 nm in thickness, and the second ferromagnetic layer 107 was made to be 1.2 nm in thickness. In the case of this example, the thinner ferromagnetic layer 106 functioned as a reference layer. Naturally, the thicknesses may also be so adjusted as to have the first ferromagnetic layer 106 be a recording layer, and the second ferromagnetic layer 107 a reference layer.

In addition, although the magnetization direction of the first ferromagnetic layer 106, which is the reference layer, is upward in the example in FIG. 5, it may also be fixed downward. In addition, at least one of the first ferromagnetic layer 106 and the second ferromagnetic layer 107 may be formed with a ferromagnetic body whose magnetization direction changes from being parallel to the film surface to being perpendicular by controlling the annealing temperature and the thickness, and the other with a multi-layer film, e.g., Co and Pt, Ni and Pt, etc., or with some other conventionally known perpendicular magnetic anisotropy material, e.g., FePt and TbTeCo alloys, etc.

Figure 6:
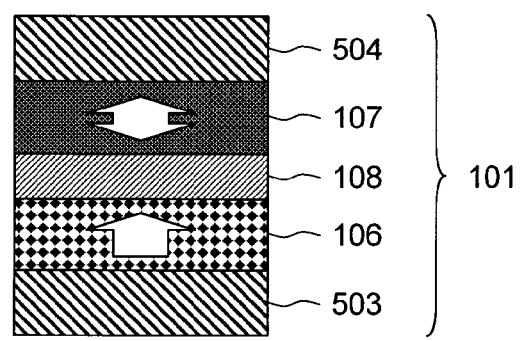
FIG. 6 is a schematic sectional view showing an example of a magnetoresistive element according to the present invention.

FIG. 6 shows an example of a case where FePt, which is a conventionally known perpendicular anisotropy material, was used for the first ferromagnetic layer 106 to make it a reference layer, and CoFeB was used for the second ferromagnetic layer 107. In this case, since the materials differ between the recording layer and the reference layer, a coercivity difference may be created with ease. With respect to the annealing temperature in this case, the resistance ratio of a magnetoresistive element in which CoFeB is used may be taken into consideration. By way of example, to obtain a resistance ratio of 100%, it may be made to be 300° C. Further, in the case of CoFeB, if annealing is to be performed at 300° C., the magnetization direction may be made perpendicular to the film surface by having the thickness be 1.0 nm to 1.6 nm. In addition, a further layer made of a ferromagnetic body containing at least one type of 3d transition metal, e.g., Co, Fe, etc., or a Heusler alloy may also be inserted between the first ferromagnetic layer 106 and the non-magnetic layer 108.

The magnetoresistive element 101 may also be of a structure comprising an underlayer 503 and a capping layer 504. Since the underlayer 503 is a layer that serves as a foundation for fabricating the magnetoresistive element 101, its surface roughness must be of a small value. By way of example, Ta and Ru may be used. It may also be of a multi-layer structure, e.g., Ta/Ru/Ta, etc. In addition, the underlayer may also be made to function as an orientation control layer. In particular, when a conventionally known perpendicular anisotropy material, e.g., FePt, etc., discussed above, is used for the first ferromagnetic layer 106, there is a strong need for orientation control. The capping layer 504 also serves the purpose of protecting the magnetoresistive element, and, by way of example, MgO, Ru, Ta, etc., may be used. The capping layer 504, too, may be of a multi-layer structure, e.g., Ta/Ru, etc.

EXAMPLE 2

Figure 7:
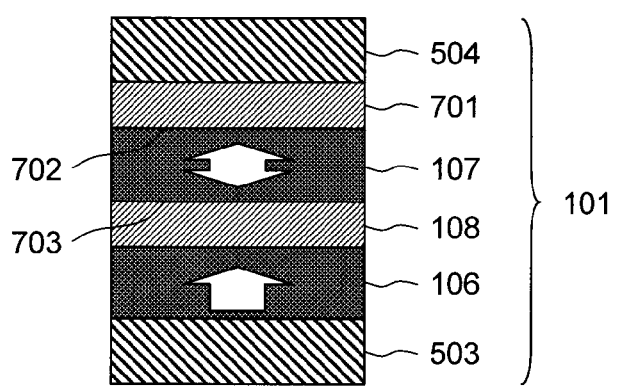
FIG. 7 is a schematic sectional view showing an example of a magnetoresistive element according to the present invention.

According to another aspect of the present invention, a magnetoresistive element may also be of a structure where a second non-magnetic layer 701 is formed at an interface 702 of the second ferromagnetic layer 107, which acts as a recording layer, on the opposite side to the non-magnetic layer 108. A schematic sectional view of a magnetoresistive element of Example 2 is shown in FIG. 7.

With the magnetoresistive element of Example 1, the interface effect for causing the magnetization of the second ferromagnetic layer 107 to be perpendicular to the film surface occurred only at an interface 703 between the second ferromagnetic layer 107 and the non-magnetic layer 108. With the magnetoresistive element 101 of Example 2, however, the interface effect also occurs at the interface 702 between the second ferromagnetic layer 107 and the second non-magnetic layer 701. Thus, as compared to the magnetoresistive element of Example 1, with the magnetoresistive element of Example 2, the magnetization direction of the second ferromagnetic layer 107 becomes more firmly perpendicular to the film surface, thereby enabling an increase in thermal stability factor. In so doing, the thickness of the second ferromagnetic layer 107 is so controlled that the magnetization would be perpendicular to the film surface and as to maximize the interface effect, and it may in some cases differ from the thickness of the second ferromagnetic layer 107 with respect to the configuration of Example 1. In the example in FIG. 7, CoFeB was used for the first ferromagnetic layer 106 and the second ferromagnetic layer 107, and MgO was used for the non-magnetic layer 108 and the non-magnetic layer 701. An annealing temperature of 300° C. in this case resulted in a resistance ratio exceeding 100%. In addition, in this example, by making the thickness of the second ferromagnetic layer 107 be 1.2 nm, the magnetization direction became perpendicular to the film surface. Candidates for the material of the second non-magnetic layer 701 include compounds containing oxygen, e.g., MgO, $Al_2O_3$, $SiO_2$, etc., and metals such as Cu, etc. It is preferable that a material that results in a greater interface effect for causing the magnetization direction of the second ferromagnetic layer 107 to be perpendicular be selected.

EXAMPLE 3

Figure 8:
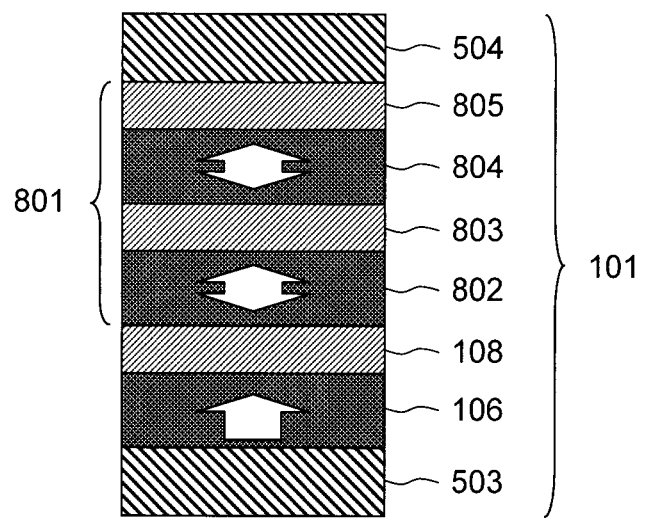
FIG. 8 is a schematic sectional view showing an example of a magnetoresistive element according to the present invention.

According to a further aspect of the present invention, a recording layer of a magnetoresistive element may be of a structure where, from the surface in contact with the non-magnetic layer 108, ferromagnetic layers and non-magnetic layers are alternately laminated. FIG. 8 shows, by way of example, a schematic sectional view for a case where, as the recording layer, four layers are laminated, as in ferromagnetic layer/non-magnetic layer/ferromagnetic layer/non-magnetic layer. Here, for a magnetoresistive element of Example 3, the recording layer may be of a laminate structure comprising three or more layers.

By adopting such a structure, because the number of interfaces between a ferromagnetic layer and a non-magnetic layer increases, there occurs a greater interface effect for causing the magnetization direction of a recording layer 801 to be perpendicular, thereby enabling an increase in thermal stability factor as compared to the magnetoresistive element of Example 2. In addition, the fact that the total volume of the ferromagnetic layer parts forming the recording layer 801 increases also contributes to the increase in thermal stability factor. For the material of the ferromagnetic layers forming the recording layer 801, a ferromagnetic material containing at least one type of 3d transition metal element, e.g., Co, Fe, etc., or a Heusler alloy is preferable. For the material of the non-magnetic layers forming the recording layer 801, candidates include compounds containing oxygen, e.g., MgO, $Al_2O_3$, $SiO_2$, etc., and metals, e.g., Cu, etc. It is preferable that materials that result in a greater interface effect for causing the magnetization direction of the recording layer 801 to be perpendicular be selected. In addition, control is necessary so that the magnetization of the ferromagnetic layers forming the recording layer 801 would be perpendicular to the film surface and so as to maximize the interface effect. There may be cases where the thickness would be different from that of the second ferromagnetic layer 107 with respect to the configuration of Example 1 or Example 2.

In the example shown in FIG. 8, the material of ferromagnetic layers 802 and 804 forming the recording layer 801 was CoFeB, and the material of non-magnetic layers 803 and 805 forming the recording layer 801 was MgO. In this example, an annealing temperature of 300° C. resulted in a resistance ratio of 100%. In addition, by having the ferromagnetic layers 802 and 804 forming the recording layer 801 in this case each be 1.2 nm in thickness, the magnetization direction became perpendicular to the film surface. Further, the magnetizations of the ferromagnetic layer 802 and the ferromagnetic layer 804 forming the recording layer 801 may be arranged to be mutually parallel or anti-parallel, and this arrangement is controlled by varying the thickness of the non-magnetic layer 803 between the two. In addition, the material of the non-magnetic layer 803 forming the recording layer 801 may also be a non-magnetic body containing at least one type of element from among such elements as Ru, Rh, V, etc. In this case, because exchange coupling occurs between the ferromagnetic layer 802 and the ferromagnetic layer 804, by controlling the thickness of the non-magnetic layer 803, the magnetization directions of the ferromagnetic layer 802 and the ferromagnetic layer 804 may be changed to be parallel or anti-parallel with ease.

EXAMPLE 4

According to another aspect of the present invention, a magnetoresistive element may also be of a structure where a third non-magnetic layer 901 is formed at an interface 903 of the first ferromagnetic layer 106, which acts as a reference layer, on the opposite side to the non-magnetic layer 108. A schematic sectional view of a magnetoresistive element of Example 4 is shown in FIG. 9.

With the magnetoresistive element of Example 1, the interface effect for causing the magnetization of the first ferromagnetic layer 106 to be perpendicular to the film surface occurred only at an interface 902 between the first ferromagnetic layer 106 and the non-magnetic layer 108. With the magnetoresistive element of Example 4, however, the interface effect also occurs at the interface 903 between the first ferromagnetic layer 106 and the third non-magnetic layer 901. Thus, as compared to the magnetoresistive element of Example 1, with the magnetoresistive element of Example 4, the magnetization direction of the first ferromagnetic layer 106 becomes more firmly perpendicular to the surface, thereby enabling an increase in thermal stability factor. In so doing, the thickness of the first ferromagnetic layer 106 is so controlled that the magnetization would be perpendicular to the film surface and as to maximize the interface effect, and it may in some cases differ from the thickness of the first ferromagnetic layer 106 with respect to the configuration of Example 1.

Figure 9:
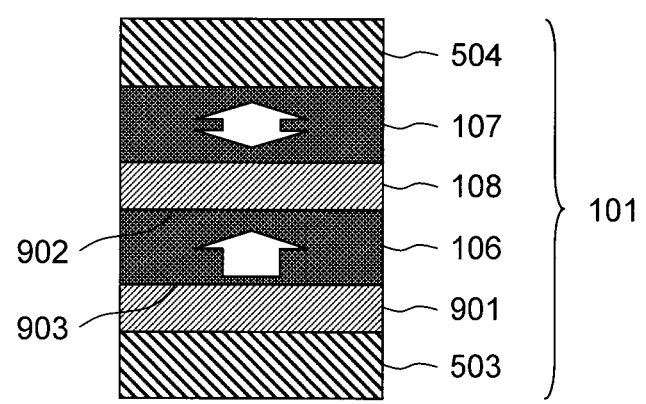
FIG. 9 is a schematic sectional view showing an example of a magnetoresistive element according to the present invention.

As an example of the structure in FIG. 9, CoFeB was used for the first ferromagnetic layer 106 and the third ferromagnetic layer 107, and MgO was used for the non-magnetic layer 108 and the non-magnetic layer 901. An annealing temperature of 300° C. resulted in a resistance ratio exceeding 100%. In addition, in this example, by having the first ferromagnetic layer 106 be 1.0 nm in thickness, the magnetization direction became perpendicular to the film surface. Candidates for the material of the third non-magnetic layer 901 include compounds containing oxygen, e.g., MgO, $Al_2O_3$, $SiO_2$, etc., and metals such as Cu, etc. It is preferable that a material that results in a greater interface effect for causing the magnetization direction of the first ferromagnetic layer 106 to be perpendicular be selected.

EXAMPLE 5

Figure 10:
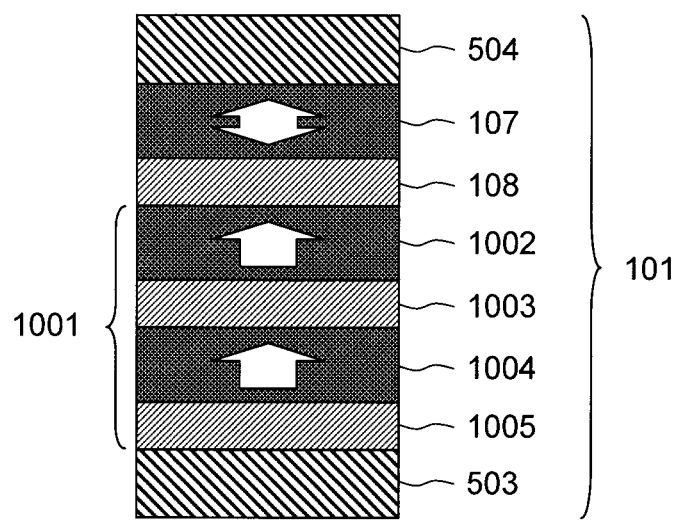
FIG. 10 is a schematic sectional view showing an example of a magnetoresistive element according to the present invention.

According to another aspect of the present invention, a reference layer 1001 of a magnetoresistive element may be of a structure where, from the surface in contact with the non-magnetic layer 108, ferromagnetic layers and non-magnetic layers are alternately laminated. FIG. 10 shows, by way of example, a sectional view for a case where, as the reference layer 1001, four layers are laminated, as in ferromagnetic layer/non-magnetic layer/ferromagnetic layer/non-magnetic layer. Here, for a magnetoresistive element of Example 5, the reference layer may be of a laminate structure comprising three or more layers.

By adopting such a structure, because the number of interfaces between a ferromagnetic layer and a non-magnetic layer increases, there occurs a greater interface effect for causing the magnetization direction of the reference layer 1001 to be perpendicular, and the total volume of the ferromagnetic layer parts forming the reference layer 1001 increases, as a result of which the magnetization direction stabilizes in the perpendicular direction to the film surface. For the material of ferromagnetic layers 1002 and 1004 forming the reference layer 1001, a ferromagnetic material containing at least one type of 3d transition metal element, e.g., Co, Fe, etc., or a Heusler alloy is preferable. For the material of non-magnetic layers 1003 and 1005 forming the reference layer 1001, candidates include compounds containing oxygen, e.g., MgO, $Al_2O_3$, $SiO_2$, etc., and metals, e.g., Cu, etc. It is preferable that materials that result in a greater interface effect for causing the magnetization direction of the reference layer 1001 to be perpendicular be selected. In addition, control is necessary so that the magnetization of the ferromagnetic layers forming the reference layer 1001 would be perpendicular to the film surface and so as to maximize the interface effect. There may be cases where the thickness would be different from that of the first ferromagnetic layer 106 with respect to the configuration of Example 1 or Example 4.

In the example of the configuration shown in FIG. 10, the material of the ferromagnetic layers 1002 and 1004 forming the reference layer 1001 was CoFeB, and the material of the non-magnetic layers 1003 and 1005 forming the reference layer 1001 was MgO. In this example, an annealing temperature of 300° C. resulted in a resistance ratio of 100%. In addition, by having the ferromagnetic layers 1002 and 1004 forming the reference layer 1001 in this case each be 1.0 nm in thickness, the magnetization direction became perpendicular to the film surface. Further, the magnetizations of the ferromagnetic layer 1002 and the ferromagnetic layer 1004 forming the reference layer 1001 may be arranged to be mutually parallel or anti-parallel, and this arrangement is controlled by varying the thickness of the non-magnetic layer 1003 between the two. In addition, the material of the non-magnetic layer 1003 forming the reference layer 1001 may also be a non-magnetic body containing at least one type of element from among such elements as Ru, Rh, V, etc. In this case, because exchange coupling occurs between the magnetizations of the ferromagnetic layer 1002 and the ferromagnetic layer 1004, by controlling the thickness of the non-magnetic layer 1003, the magnetization directions of the ferromagnetic layer 1002 and the ferromagnetic layer 1004 may be changed to be parallel or anti-parallel with ease.

EXAMPLE 6

Figure 11:
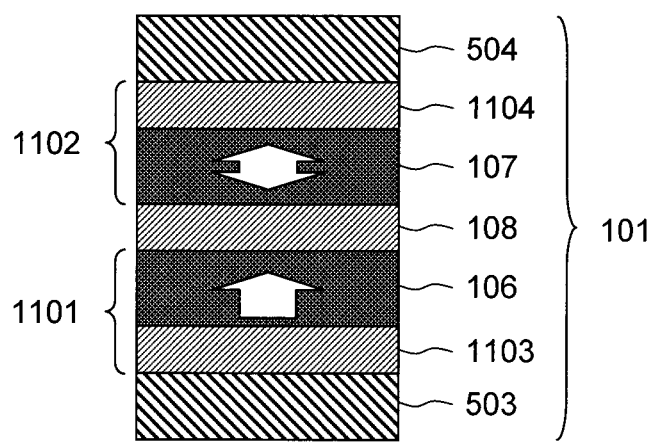
FIG. 11 is a schematic sectional view showing an example of a magnetoresistive element according to the present invention.

According to another aspect of the present invention, a magnetoresistive element may also be of a structure comprising a non-magnetic layer 1103 and a non-magnetic layer 1104, the non-magnetic layer 1103 being formed for a reference layer 1101 at an interface of the first ferromagnetic layer 106 on the opposite side to the non-magnetic layer 108, and the non-magnetic layer 1104 being formed for a recording layer 1102 at an interface of the second ferromagnetic layer 107 on the opposite side to the non-magnetic layer 108. A schematic sectional view of a magnetoresistive element of Example 6 is shown in FIG. 11. By adopting such a configuration, both the reference layer and the recording layer stabilize in the perpendicular direction to the film surface.

EXAMPLE 7

Figure 12:
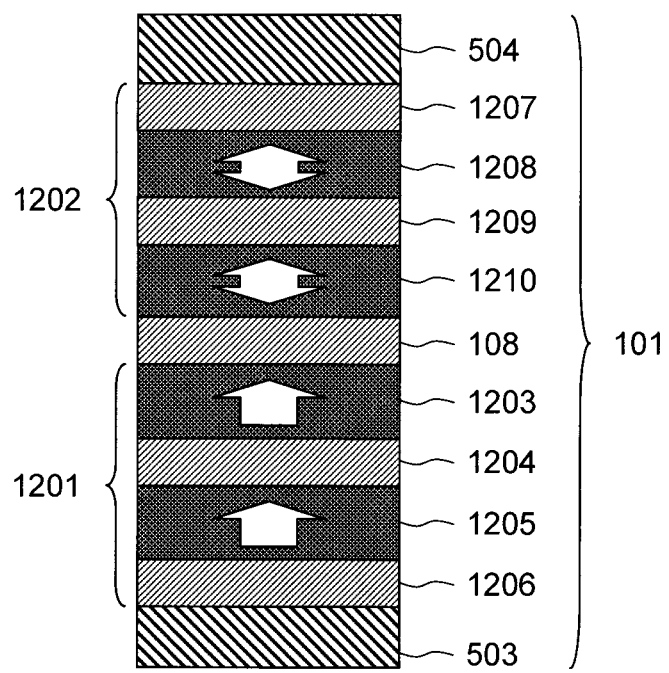
FIG. 12 is a schematic sectional view showing an example of a magnetoresistive element according to the present invention.

According to another aspect of the present invention, a magnetoresistive element may also be of a configuration comprising: as a reference layer 1201, a structure where, from the surface in contact with the non-magnetic layer 108, ferromagnetic layers and non-magnetic layers are alternately laminated; and, as a recording layer 1202, a structure where, from the surface in contact with the non-magnetic layer 108, ferromagnetic layers and non-magnetic layers are alternately laminated. FIG. 12 shows, by way of example, a schematic sectional view for a case where, as the reference layer 1201, four layers are laminated, as in ferromagnetic layer 1203/non-magnetic layer 1204/ferromagnetic layer 1205/non-magnetic layer 1206 in order from the side of the non-magnetic layer 108, and where, as the recording layer 1202, four layers are laminated, as in ferromagnetic layer 1210/non-magnetic layer 1209/ferromagnetic layer 1208/non-magnetic layer 1207 in order from the side of the non-magnetic layer 108. By adopting such a configuration, both the reference layer and the recording layer stabilize in the perpendicular direction to the film surface.

EXAMPLE 8

Figure 13:
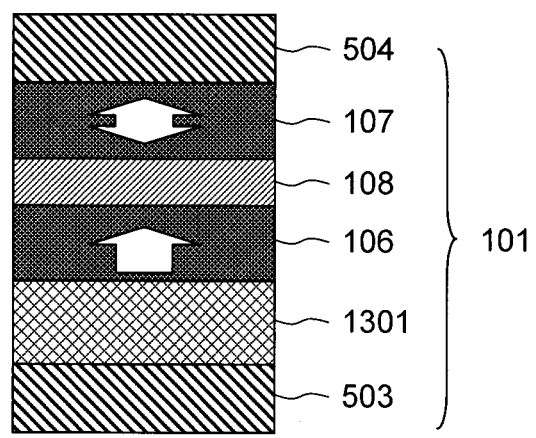
FIG. 13 is a schematic sectional view showing an example of a magnetoresistive element according to the present invention.

According to another aspect of the present invention, with respect a magnetoresistive element, the configuration may also be one in which an antiferromagnetic layer 1301 is formed at an interface of the reference layer 106 on the opposite side to the non-magnetic layer 108 as shown in the schematic sectional view in FIG. 13. By adopting such a configuration, the magnetization direction of the reference layer 106 stabilizes in the perpendicular direction to the film surface.

EXAMPLE 9

Figure 14:
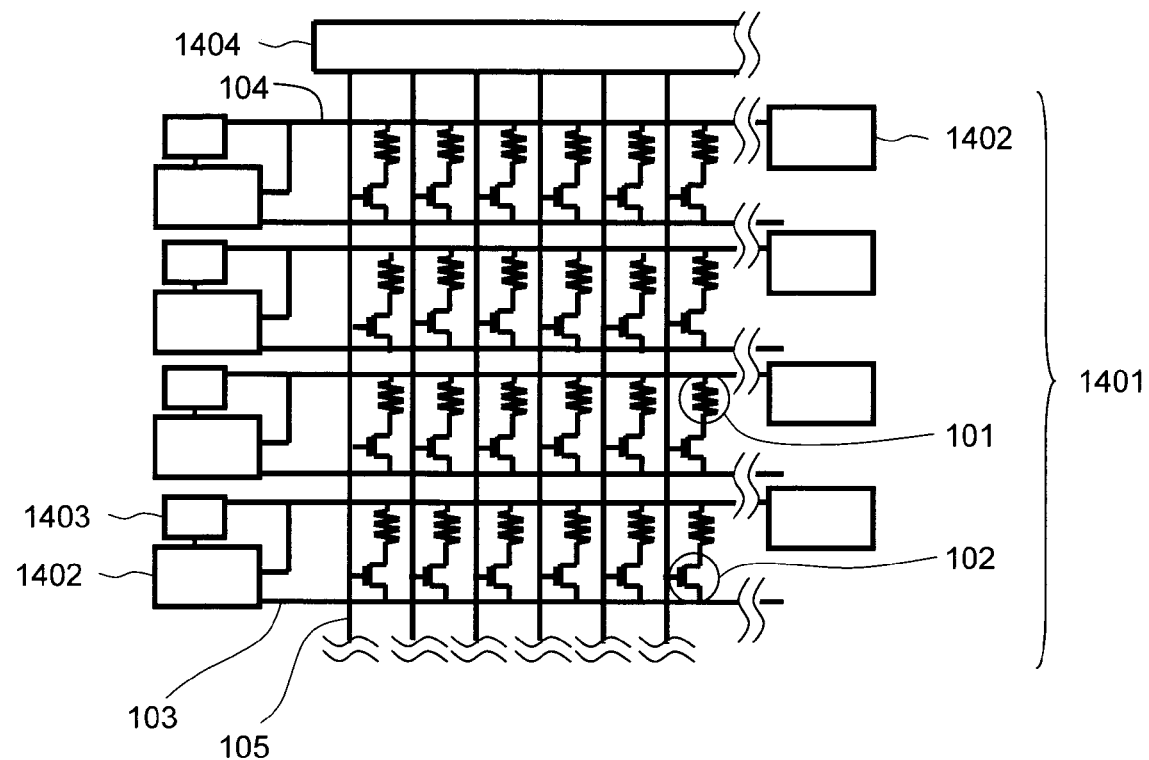
FIG. 14 is a conceptual diagram showing an example of magnetic memory according to the present invention.

According to another aspect of the present invention, it is possible to realize a MRAM by employing the magnetoresistive elements of Examples 1-8 as recording elements. A MRAM of the present invention comprises, as shown in FIG. 14: a plurality of bit lines 104 disposed parallel to one another; a plurality of source lines 103 disposed parallel to the bit lines 104 as well as to one another; and a plurality of word lines 105 disposed perpendicularly to the bit lines 104 and parallel to one another. A memory cell 100 is disposed at each point of intersection between the bit lines 104 and the word lines 105. The memory cells 100 each comprise the magnetoresistive element 101 of Examples 1-8 and a select transistor 102. The plurality of memory cells 100 form a memory array 1401. The bit line 104 is electrically connected with the drain electrode of the select transistor 102 via the magnetoresistive element 101. The source line 103 is electrically connected with the source electrode of the select transistor 102 via a wire layer. In addition, the word line 105 is electrically connected with the gate electrode of the select transistor 102. One end of the source line 103 and the bit line 104 is electrically connected with a write driver 1402 and a sense amplifier 1403 for applying a voltage. One end of the word line 105 is electrically connected with a word driver 1404.

In a "0" write operation, a current is passed through the source line 103 from the bit line 104 via the magnetoresistive element 101 by applying a voltage across the bit line 104 from the write driver 1402, while also applying a voltage across the word line 105 from the word driver 1404. In this case, if, as in FIG. 6, the configuration of the magnetoresistive element 101 is such that the first ferromagnetic layer 106 is the reference layer and the second ferromagnetic layer 107 is the recording layer, the magnetoresistive element 101 becomes low in resistance, and the information held by the magnetoresistive element 101 becomes "0". On the other hand, in a "1" write operation, a current is passed through the bit line 104 from the source line 103 via the magnetoresistive element 101 by applying a voltage across the source line 103 from the write driver 1402, while also applying a voltage across the word line 105 from the word driver 1404. In this case, the magnetoresistive element 101 becomes high in resistance, and the information held by the magnetoresistive element 101 becomes "1". When reading, differences in the signal caused by changes in resistance are read using the sense amplifier 1403. By adopting a memory array of such a configuration, the magnetoresistance ratio increases, the switching current density decreases, and the thermal stability factor increases. Thus, the MRAM is able to operate as a non-volatile memory.

REFERENCE SIGNS LIST

100 Memory cell of magnetic memory
101 Magnetoresistive element
102 Select transistor
103 Source line
104 Bit line
105 Word line
106 First ferromagnetic layer
107 Second ferromagnetic layer
108 Non-magnetic layer
501 Magnetization
502 Magnetization
503 Underlayer
504 Capping layer
701 Second non-magnetic layer
801 Recording layer
802 Ferromagnetic layer
803 Non-magnetic layer
804 Ferromagnetic layer
805 Non-magnetic layer
901 Non-magnetic layer
1001 Reference layer
1002 Ferromagnetic layer
1003 Non-magnetic layer
1004 Ferromagnetic layer
1005 Non-magnetic layer
1101 Reference layer
1102 Recording layer
1103 Non-magnetic layer
1104 Non-magnetic layer
1201 Reference layer
1202 Recording layer
1203 Ferromagnetic layer
1204 Non-magnetic layer
1205 Ferromagnetic layer
1206 Non-magnetic layer
1207 Non-magnetic layer
1208 Ferromagnetic layer
1209 Non-magnetic layer
1210 Ferromagnetic layer
1301 Antiferromagnetic layer
1401 Memory array
1402 Write driver
1403 Sense amplifier
1404 Word driver

The invention claimed is:

1. A magnetoresistive element comprising:
a reference layer having a fixed magnetization direction and including a ferromagnetic material containing Fe;
one non-magnetic layer that is directly formed on one surface of the reference layer and that includes an insulator containing oxygen;
a recording layer that is directly formed on one surface of the one non-magnetic layer, which is opposite to another surface on which the reference layer is formed, the recording layer having a variable magnetization direction and including a ferromagnetic material containing at least one type of 3d transition metal; and
another non-magnetic layer that is directly formed on another surface of the reference layer so that the reference layer is formed between the one and the other non-magnetic layers and the one and the other non-magnetic layers are both external to the reference layer, the other non-magnetic layer including an insulator containing oxygen, wherein
the reference layer, and the one and the other non-magnetic layers are arranged so that a magnetization direction of the reference layer is controlled to be perpendicular to a layer surface of the reference layer by perpendicular magnetic anisotropy at interfaces between the reference layer and the one non-magnetic layer, and between the reference layer and the other non-magnetic layer, resulting from the reference layer having a predetermined thickness, and
the other non-magnetic layer stabilizes the perpendicularity of magnetization direction of the reference layer to the reference layer surface.

2. The magnetoresistive element according to claim 1, wherein the predetermined thickness of the reference layer is equal to or less than 3 nm.

3. The magnetoresistive element according to claim 1, wherein the reference layer further includes at least one of Co and B.

4. The magnetoresistive element according to claim 1, wherein the one and the other non-magnetic layers further include Mg.

5. The magnetoresistive element according to claim 1, further comprising an additional non-magnetic layer that is directly formed on one surface of the recording layer, which is opposite to another surface on which the one non-magnetic layer is formed on and that includes an insulator containing oxygen.

6. The magnetoresistive element according to claim 5, wherein the additional non-magnetic layer further includes Mg.

7. The magnetoresistive element according to claim 1, wherein
the reference layer has a laminate structure including a plurality of alternating ferromagnetic and non-magnetic laminated layers,
uppermost and lowermost layers of the laminate structure are the ferromagnetic laminated layers, and
the ferromagnetic laminated layer includes a ferromagnetic material containing Fe, and the non-magnetic laminated layer includes an insulator containing oxygen.

8. The magnetoresistive element according to claim 7, wherein the ferromagnetic laminated layer further includes at least one of Co and B, and the non-magnetic laminated layer further includes Mg.

9. A magnetoresistive element comprising:
a reference layer having a fixed magnetization direction and including a ferromagnetic material containing at least one type of 3d transition metal;
one non-magnetic layer that is directly formed on one surface of the reference layer and that includes an insulator containing oxygen;
a recording layer that is directly formed on one surface of the one non-magnetic layer, which is opposite to another surface on which the reference layer is formed, the recording layer having a variable magnetization direction and including a ferromagnetic material containing Fe; and
another non-magnetic layer that is directly formed on one surface of the recording layer, which is opposite to another surface on which the one non-magnetic layer is formed, so that the recording layer is formed between the one and the other non-magnetic layers and the one and the other non-magnetic layers are both external to the recording layer, the other non-magnetic layer including an insulator containing oxygen, wherein
the recording layer, and the one and the other non-magnetic layers are arranged so that a magnetization direction of the recording layer is controlled to be perpendicular to a layer surface of the recording layer by perpendicular magnetic anisotropy at interfaces between the recording layer and the one non-magnetic layer, and between the recording layer and the other non-magnetic layer, resulting from the recording layer having a predetermined thickness, and
the other non-magnetic layer stabilizes the perpendicularity of magnetization direction of the recording layer to the recording layer surface.

10. The magnetoresistive element according to claim 9, wherein the predetermined thickness of the recording layer is equal to or less than 3 nm.

11. The magnetoresistive element according to claim 9, wherein the recording layer further includes at least one of Co and B.

12. The magnetoresistive element according to claim 9, wherein the one and the other non-magnetic layers further include Mg.

13. The magnetoresistive element according to claim 9, wherein
the recording layer has a laminate structure including a plurality of alternating ferromagnetic and non-magnetic laminated layers,
uppermost and lowermost layers of the laminate structure are the ferromagnetic laminated layers, and
the ferromagnetic laminated layer includes a ferromagnetic material containing Fe, and the non-magnetic laminated layer includes an insulator containing oxygen.

* * * * *